(12) United States Patent
Huang

(10) Patent No.: US 11,362,289 B2
(45) Date of Patent: Jun. 14, 2022

(54) ORGANIC LIGHT EMITTING DIODE DISPLAY PANEL HAVING LIGHT EMITTING LAYER LOCATED ON BENT AND NON-BENT AREAS

(71) Applicant: WUHAN CHINA STAR OPTOELECTRONICS SEMICONDUCTOR DISPLAY TECHNOLOGY CO., LTD., Wuhan (CN)

(72) Inventor: Qian Huang, Wuhan (CN)

( * ) Notice: Subject to any disclaimer, the term of this patent is extended or adjusted under 35 U.S.C. 154(b) by 196 days.

(21) Appl. No.: 16/622,945

(22) PCT Filed: Aug. 14, 2019

(86) PCT No.: PCT/CN2019/100547
§ 371 (c)(1),
(2) Date: Dec. 16, 2019

(87) PCT Pub. No.: WO2020/258458
PCT Pub. Date: Dec. 30, 2020

(65) Prior Publication Data
US 2021/0328161 A1    Oct. 21, 2021

(30) Foreign Application Priority Data
Jun. 25, 2019   (CN) .......................... 201910552254.7

(51) Int. Cl.
*H01L 51/00*   (2006.01)
*G09G 3/3225*   (2016.01)
(Continued)

(52) U.S. Cl.
CPC ....... *H01L 51/0097* (2013.01); *G09G 3/3225* (2013.01); *H01L 27/326* (2013.01);
(Continued)

(58) Field of Classification Search
CPC ............. H01L 27/3276; H01L 51/0097; H01L 51/441; H01L 27/3237; H01L 27/326;
(Continued)

(56) References Cited

U.S. PATENT DOCUMENTS

| | | | |
|---|---|---|---|
| 2014/0097408 A1* | 4/2014 | Kim ................... | H01L 27/3276 257/40 |
| 2015/0233557 A1* | 8/2015 | Aoyama ................... | F21S 4/22 362/183 |
| 2019/0013486 A1 | 1/2019 | Li | |

FOREIGN PATENT DOCUMENTS

| | | |
|---|---|---|
| CN | 106251780 A | 12/2016 |
| CN | 107204357 A | 9/2017 |

\* cited by examiner

*Primary Examiner* — Ermias T Woldegeorgis
(74) *Attorney, Agent, or Firm* — JMB Davis Ben-David

(57) ABSTRACT

An organic light-emitting diode (OLED) display panel includes a flexible substrate layer including a first area and two second area. A bending stress applied to the first area is greater than a bending stress applied to the second areas. A driver circuit layer is disposed on the second areas and non-bent areas. An organic planarization portion includes a first organic planarization layer disposed on the first area, and a second organic planarization layer disposed on the driver circuit layer and the first organic planarization layer. A light-emitting layer is disposed on the second organic planarization layer and located on the bent area and the non-bent areas.

20 Claims, 3 Drawing Sheets

(51) Int. Cl.
  *H01L 27/32* (2006.01)
  *G09F 9/33* (2006.01)
  *G09F 9/30* (2006.01)

(52) U.S. Cl.
  CPC ...... *H01L 27/3248* (2013.01); *H01L 27/3258* (2013.01); *G09F 9/301* (2013.01); *G09F 9/33* (2013.01); *Y02E 10/549* (2013.01)

(58) Field of Classification Search
  CPC .......... H01L 2251/5338; H05K 1/0281; H05K 1/0277; H05K 3/28; H05K 2201/09909; H05K 2201/2009; G06F 1/1652; G09G 3/3225; Y02E 10/549
  See application file for complete search history.

ORGANIC LIGHT EMITTING DIODE DISPLAY PANEL HAVING LIGHT EMITTING LAYER LOCATED ON BENT AND NON-BENT AREAS

CROSS-REFERENCE TO RELATED APPLICATIONS

This is the U.S. National Stage of International Patent Application No. PCT/CN2019/100547 filed Aug. 14, 2019, which in turn claims the benefit of Chinese Patent Application No. 201910552254.7 filed Jun. 25, 2019.

1. FIELD OF APPLICATION

The present application relates to a technical field of displays, and particularly to, an organic light-emitting diode (OLED) display panel.

2. RELATED ART

With the release of bendable display products from companies, such as Rouyu and Samsung, a new display technology revolution has been introduced. In bendable display products, center areas of bending portions are areas where stress is most concentrated. During dynamically bending operations, such areas are prone to breakage of films giving rise to device failure due to stress.

Therefore, it is imperative to overcome drawbacks in current technology.

SUMMARY OF APPLICATION

An object of the present application is to provide an organic light-emitting diode (OLED) display panel capable of overcoming a technical problem of device failure resulting from breakage of films due to stress An organic light-emitting diode (OLED) display panel of an embodiment of the present application comprising: a flexible substrate layer comprising a bent area and two non-bent areas connected to two sides of the bent area, wherein the bent area comprises a first area and two second areas disposed on two opposite sides of the first area, and a bending stress applied to the first area is greater than a bending stress applied to the second areas; a driver circuit layer disposed on the second areas and the non-bent areas; an organic planarization portion comprising a first organic planarization layer and a second organic planarization layer, wherein the first organic planarization layer is disposed on the first area, and the second organic planarization layer is disposed on the driver circuit layer and the first organic planarization layer; and a light-emitting layer disposed on the second organic planarization layer and located on the bent area and the non-bent areas; wherein the first area has a width greater than or equal to that of a pixel of the light-emitting layer.

In the OLED display panel of the present application, the driver circuit layer comprises a first portion configured to drive the light-emitting layer on the non-bent areas, and a second portion configured to drive the light-emitting layer on the bent area, wherein the first portion is electrically connected to the second portion.

In the OLED display panel of the present application, the driver circuit layer comprises a third metal layer disposed on the flexible substrate layer, and the third metal layer comprises a plurality of source electrodes and drain electrodes.

In the OLED display panel of the present application, the driver circuit layer further comprises: a first insulating layer disposed on the flexible substrate layer; a semiconductor material layer disposed on the first insulating layer; a second insulting layer disposed on the first insulating layer and the semiconductor material layer; a first gate layer disposed on the second insulating layer and located right above the semiconductor material layer; a third insulating layer disposed on the first gate layer and the second insulating layer; a second gate layer disposed on the third insulating layer and located right above the first gate layer; a first interlayer dielectric layer disposed on the second gate layer and the third insulating layer; and a second interlayer dielectric layer disposed on the first interlayer dielectric layer, wherein the third metal layer is disposed on the second interlayer dielectric layer.

In the OLED display panel of the present application, the light-emitting layer comprises: an anode metal layer disposed on the second organic planarization layer; an organic light-emitting layer disposed on the anode metal layer; and a cathode layer disposed on the organic light-emitting layer.

In the OLED display panel of the present application, a first connecting metal is disposed on the first area and is configured to be connected to the drain electrodes on the first area, and the organic planarization portion covers the third metal layer, the first connecting metal, and the first area; wherein the organic planarization layer is configured with a first electrically conductive hole exposed to the organic planarization layer so that the first connecting metal is electrically connected to the light-emitting layer.

In the OLED display panel of the present application, the anode metal layer extends to the second organic planarization layer on the second portion from the second organic planarization layer on the first portion, and the second organic planarization layer is configured with a second electrically conductive hole exposed to the second organic planarization layer so that the anode metal layer is electrically connected to the drain electrodes.

In the OLED display panel of the present application, each of the first organic planarization layer and the second organic planarization layer is formed by one-time deposition.

In the OLED display panel of the present application, a second connecting metal is disposed between the first organic planarization layer and the second organic planarization layer and is configured to be connected to the drain electrodes on the first area, and the second organic planarization layer is configured with a third electrically conductive hole exposed to the second organic planarization layer so that the second connecting metal is electrically connected to the anode metal layer.

In the OLED display panel of the present application, the anode metal layer extends to the second organic planarization layer on the second portion from the second organic planarization layer on the first portion, and the second organic planarization layer is configured with a fourth electrically conductive hole exposed to the second organic planarization layer so that the drain electrodes are electrically connected to the anode metal layer.

The present application further provides an organic light-emitting diode (OLED) display panel, comprising:

In the OLED display panel of the present application, comprising: a flexible substrate layer comprising a bent area and two non-bent areas connected to two sides of the bent area, wherein the bent area comprises a first area and two second areas disposed on two opposite sides of the first area, and a bending stress applied to the first area is greater than a bending stress applied to the second areas; a driver circuit layer disposed on the second areas and the non-bent areas; an organic planarization portion comprising a first organic planarization layer and a second organic planarization layer, wherein the first organic planarization layer is disposed on the first area, and the second organic planarization layer is disposed on the driver circuit layer and the first organic planarization layer; and a light-emitting layer disposed on the second organic planarization layer and located on the bent area and the non-bent areas.

In the OLED display panel of the present application, the driver circuit layer comprises a first portion configured to drive the light-emitting layer on the non-bent areas, and a second portion configured to drive the light-emitting layer on the bent area, wherein the first portion is electrically connected to the second portion.

In the OLED display panel of the present application, the driver circuit layer comprises a third metal layer disposed on the flexible substrate layer, and the third metal layer comprises a plurality of source electrodes and drain electrodes.

In the OLED display panel of the present application, the driver circuit layer further comprises: a first insulating layer disposed on the flexible substrate layer; a semiconductor material layer disposed on the first insulating layer; a second insulting layer disposed on the first insulating layer and the semiconductor material layer; a first gate layer disposed on the second insulating layer and located right above the semiconductor material layer; a third insulating layer disposed on the first gate layer and the second insulating layer; a second gate layer disposed on the third insulating layer and located right above the second gate layer; a first interlayer dielectric layer disposed on the second gate layer and the third insulating layer; and a second interlayer dielectric layer disposed on the first interlayer dielectric layer, wherein the third metal layer is disposed on the second interlayer dielectric layer.

In the OLED display panel of the present application, the light-emitting layer comprises: an anode metal layer disposed on the second organic planarization layer; an organic light-emitting layer disposed on the anode metal layer; and a cathode layer disposed on the organic light-emitting layer.

In the OLED display panel of the present application, the first organic planarization layer and the second organic planarization layer both are an integral structure formed by one-time deposition.

In the OLED display panel of the present application, a first connecting metal is disposed on the first area and is configured to be connected to the drain electrodes on the first area, and the organic planarization portion covers the third metal layer, the first connecting metal, and the first area; wherein the organic planarization layer is configured with a first electrically conductive hole exposed to the organic planarization layer so that the first connecting metal is electrically connected to the light-emitting layer.

In the OLED display panel of the present application, the anode metal layer extends to the second organic planarization layer on the second portion from the second organic planarization layer on the first portion, and the second organic planarization layer is configured with a second electrically conductive hole exposed to the second organic planarization layer so that the anode metal layer is electrically connected to the drain electrodes.

In the OLED display panel of the present application, the first organic planarization layer and the second organic planarization layer both are formed by one-time deposition.

In the OLED display panel of the present application, a second connecting metal is disposed between the first organic planarization layer and the second organic planarization layer and is configured to be connected to the drain electrodes on the first area, and the second organic planarization layer is configured with a third electrically conductive hole exposed to the second organic planarization layer so that the second connecting metal is electrically connected to the anode metal layer.

In the OLED display panel of the present application, the anode metal layer extends to the second organic planarization layer on the second portion from the second organic planarization layer on the first portion, and the second organic planarization layer is configured with a fourth electrically conductive hole exposed to the second organic planarization layer so that the drain electrodes are electrically connected to the anode metal layer.

Based on the OLED display panel of the present application, circuits in an area where the stress is large in the bent area are transferred to an area where the stress is less on both sides of the bent area, and the first area under the larger stress is set to be the organic planarization layer, thereby improving bending performance of the OLED display panel, avoiding device failure caused by breakage of films, and enhancing circuit stability.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present application, and a person skilled in the art may still derive other drawings from these accompanying drawings without creative efforts.

DESCRIPTION OF PREFERRED EMBODIMENTS

Figure 1:
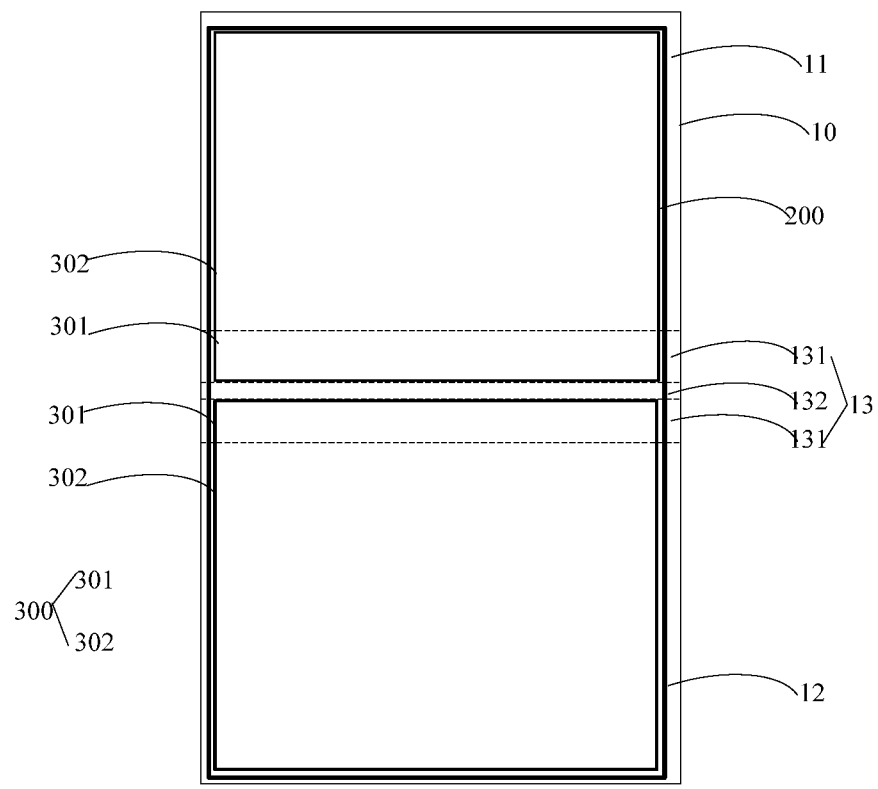
FIG. 1 is a schematic structural view of an organic light-emitting diode (OLED) display panel of an embodiment of the present application.

Hereafter, embodiments of the present application will be described in detail with reference to the accompanying drawings, wherein same or like reference numerals designate same or like elements or elements having same or like functions throughout the specification. The embodiments described with reference to the accompanying drawings are to be regarded as illustrative to only explain the present application, but not to be construed as limiting the present application.

In the description of the present application, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicates orientation or the orientation or positional relationship based on the positional relationship shown in the drawings, for convenience of description only and the present application is to simplify the description, but does not indicate or imply that the device or element referred to must have a particular orientation in a particular orientation construction and operation, and therefore not be construed as limiting the present application. In addition, the terms "first", "second" are used to indicate or imply relative importance or the number of technical features specified implicitly indicated the purpose of description and should not be understood. Thus, there is defined "first", "second" features may be explicitly or implicitly including one or more of the features. In the description of the new practice, the meaning of "plurality" is at least two, e.g. two, three, etc., unless explicitly specifically limited.

Figure 2:
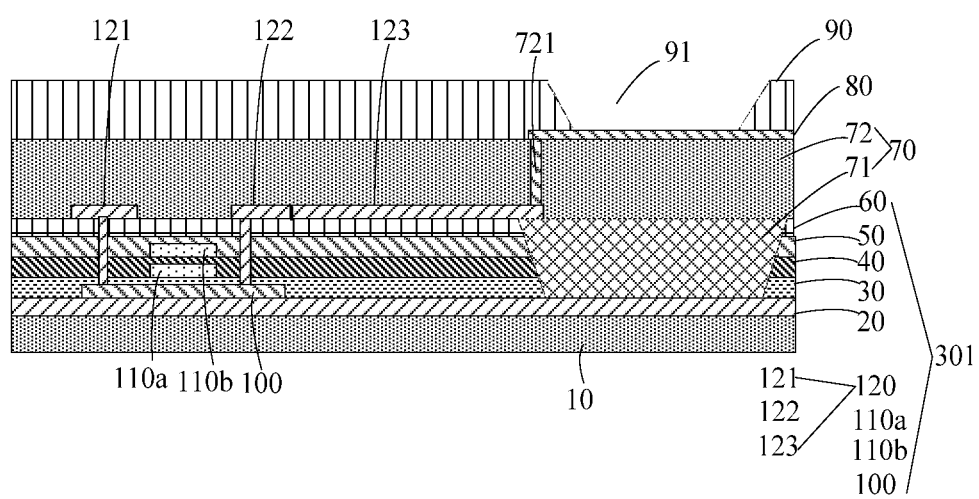
FIG. 2 is a first partial cross-sectional view of an OLED display panel of an embodiment of the present application.

Please refer to FIG. 1 in combination with FIG. 2. FIG. 1 is a schematic structural view of an organic light-emitting diode (OLED) display panel of an embodiment of the present application. FIG. 2 is a first partial cross-sectional view of an OLED display panel of an embodiment of the present application. The OLED display panel includes a flexible substrate layer 10, a driver circuit layer 300, an organic planarization portion 70, and a light-emitting layer 200.

The flexible substrate layer 10 is made of polyimide (PI) and has good bending performance. Certainly, it can be made of other material. The driver circuit layer 300 is disposed on the flexible substrate layer 10. The organic planarization portion 70 is disposed on the driver circuit layer 300 and the flexible substrate layer. The light-emitting layer 200 is disposed on the organic planarization portion 70.

Specifically, the flexible substrate layer 10 includes a bent area 13 and two non-bent areas 11 connected to two sides of the bent area 13. The bent area 13 includes a first area 132 and two second areas 132 disposed on two opposite sides of the first area 131, and a bending stress applied to the first area 132 is greater than a bending stress applied to the second areas 131. The light-emitting area 200 is disposed on the non-bent areas 11. The flexible substrate layer 10 is bendable about the bent area 13 to allow the non-bent areas 11 to be folded, thereby to fulfill folding up or to form a certain angle. The first area 132 has a width greater than or equal to that of a pixel of the light-emitting layer, wherein the width of the pixel may be a width of one pixel or a width of more than one pixel.

The driver circuit layer 300 includes a first portion 301 configured to drive the light-emitting layer 200 on the non-bent areas 11, and a second portion 302 configured to drive the light-emitting layer 200 on the bent area 13. The first portion 301 is electrically connected to the second portion 302, wherein the driver circuit layer 300 a first insulating layer 20, a second insulating layer 30, a third insulating layer 40, a first interlayer dielectric layer 50, a second interlayer dielectric layer 60, a semiconductor material layer 110, a first gate layer 110a, a second gate layer 110b, and a third metal layer 120 all sequentially disposed on one another. The first insulating layer 20 is formed by depositing an insulating material, such as silicon nitride or silicon dioxide, and is disposed on the flexible substrate layer. The semiconductor material layer 110 is disposed on the first insulating layer 20 and forms a channel by a doping process. The second insulating layer 30 is formed by depositing an insulating material, such as silicon nitride or silicon dioxide, and is disposed on the first insulating layer and the semiconductor material layer. The first gate layer 110a is disposed on the second insulating layer 30 and located right above the semiconductor material layer. The third insulating layer 40 is disposed on the first gate layer 110a and the second insulating layer 30. The second gate layer 110b is disposed on the third insulating layer 40 and located right above the first gate layer 110a. The first interlayer dielectric layer 50 is disposed on the second gate layer and the third insulating layer. The second interlayer dielectric layer 60 is disposed on the first interlayer dielectric layer 50. The third metal layer 120 is disposed on the second interlayer dielectric layer 60. The third metal layer 120 forms a source electrode 121 and a drain electrode 122. The third metal layer 120 further forms a second connecting metal 123 disposed between a first organic planarization layer 71 and a second organic planarization layer 72 and connected to the drain electrode 122. The second organic planarization layer 72 is configured with a third electrically conductive hole 721 which is exposed to the second organic planarization layer 72 and is configured to connect the second connecting metal and the anode metal layer 80.

The organic planarization portion 70 includes the first organic planarization layer 71 and the second organic planarization layer 72. The first organic planarization layer 71 is disposed on the first area, and the second organic planarization layer 72 is disposed on the driver circuit layer 300 and the first organic planarization layer 71. The first organic planarization layer 71 and the second organic planarization layer 72 may be two organic layers formed by two depositions. In the present application, the organic planarization layer 70 is a flat buffer layer formed by using an organic material.

The light-emitting layer 200 is located on the bent area and the non-bent areas. The light-emitting layer 200 includes the anode metal layer 80, an organic light-emitting layer, and a cathode layer. The anode metal layer 80 is disposed on the second organic planarization layer; the organic light-emitting layer disposed on the anode metal layer; and the cathode layer is disposed on the organic light-emitting layer. Specifically, the anode metal layer 80 is disposed on the second organic planarization layer 72 and is electrically connected to the first portion 301 and the second portion 302. The anode metal layer 80 is electrically connected to the second connecting metal 123 through the third electrically conductive hole 721 and is thus electrically connected to the drain electrode. A protective insulating layer 90 is formed between the anode metal layer 80 and the organic light-emitting layer. The protective insulating layer 90 is deposited on the anode metal layer 80 and the second organic planarization layer 72. The protective insulating layer 90 is made of nitride silicon. In certain embodiments, in order to improve bending performance, the protective insulating layer 90 located above the first area may be removed to form a notch portion 91.

Figure 3:
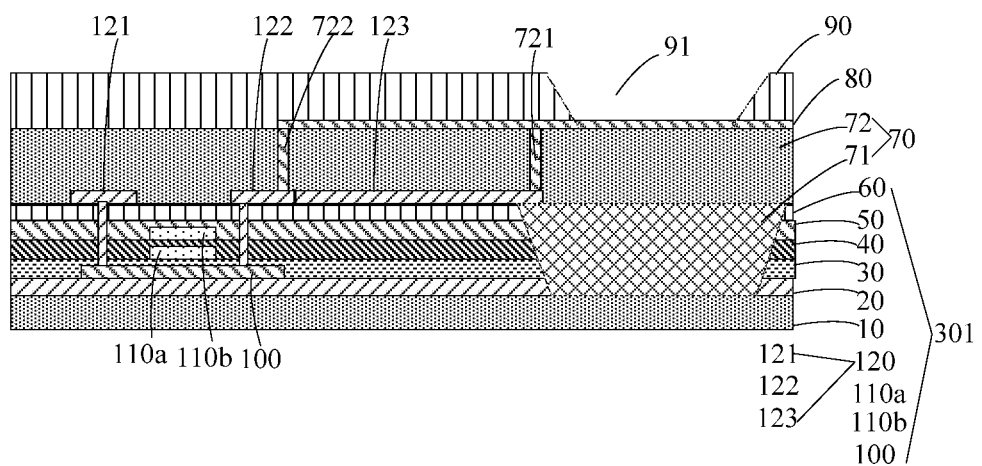
FIG. 3 is a second partial cross-sectional view of an OLED display panel of an embodiment of the present application.

Please refer to FIG. 3. FIG. 3 is a second partial cross-sectional view of an OLED display panel of an embodiment of the present application. In certain embodiments, in order to enhance electrical stability between the anode metal layer 80 and the drain electrode, the anode metal layer 80 extends to the second organic planarization layer 72 on the second portion from the second organic planarization layer 72 on the first portion. The second organic planarization layer 72 is configured with a fourth electrically conductive hole 722 exposed to the second organic planarization layer 72 so that the drain electrode 122 is electrically connected to the anode metal layer 80.

Figure 4:
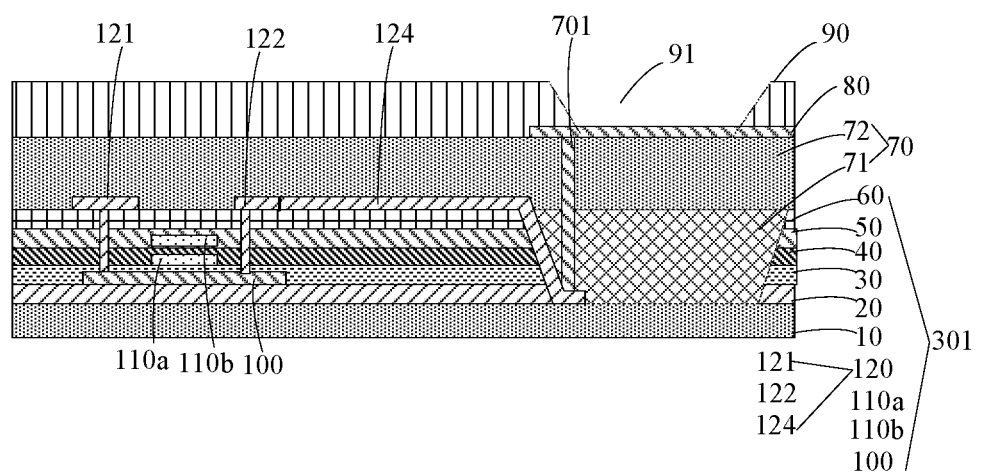
FIG. 4 is a third partial cross-sectional view of an OLED display panel of an embodiment of the present application.

Please refer to FIG. 4. FIG. 4 is a third partial cross-sectional view of an OLED display panel of an embodiment of the present application. In certain embodiments, the first organic planarization layer 71 and the second organic planarization at layer 72 are an integral structure formed by one deposition. A first connecting metal 124 is disposed on the first area 132 and is configured to be connected to the drain electrode 122. The organic planarization portion 70 covers the third metal layer 120, the second interlayer dielectric layer 60, the first connecting metal 124, and the first area 132. The organic planarization layer 70 is configured with a first electrically conductive hole 701 exposed to the organic planarization layer 70 so that the first connecting metal 124 is electrically connected to the anode metal layer 80.

Figure 5:
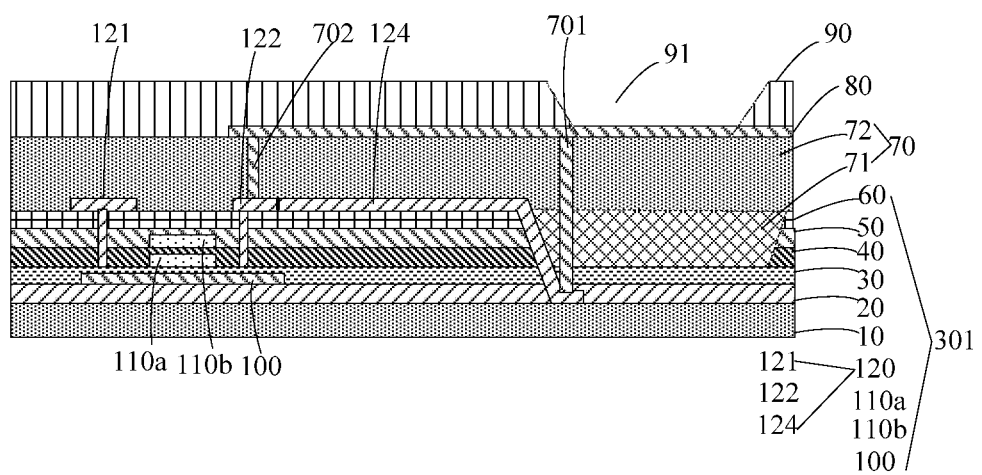
FIG. 5 is a fourth partial cross-sectional view of an OLED display panel of an embodiment of the present application.

Please refer to FIG. 5. FIG. 5 is a fourth partial cross-sectional view of an OLED display panel of an embodiment of the present application. In certain embodiments, in order to enhance electrical stability, the anode metal layer 80 extends to the second organic planarization layer 72 on the second portion from the second organic planarization layer 72 on the first portion. The second organic planarization layer 72 is configured with a second electrically conductive hole 702 exposed to the second organic planarization layer 72 so that the anode metal layer 80 is electrically connected to the drain electrode 122.

As can be seen from the above, based on the present application, circuits in an area where the stress is large in the bent area are transferred to an area where the stress is less on both sides of the bent area, and the first area under the larger stress is set to be the organic planarization layer, thereby improving bending performance of the OLED display panel, avoiding device failure caused by breakage of films, and enhancing circuit stability.

Accordingly, although the present application has been disclosed as a preferred embodiment, it is not intended to limit the present application. Those skilled in the art without departing from the spirit and scope of the present application may make various changes or modifications, and thus the scope of the present application should be after the appended claims and their equivalents.

The above are only the embodiments of the present invention, and are not intended to limit the scope of the invention. The equivalent structure or equivalent process transformations made by the present specification and the drawings, or directly or indirectly applied to other related technical fields are included in the scope of patent protection of the present invention.

What is claimed is:

1. An organic light-emitting diode (OLED) display panel, comprising:
   a flexible substrate layer comprising a bent area and two non-bent areas connected to two sides of the bent area, wherein the bent area comprises a first area and two second areas disposed on two opposite sides of the first area, and a bending stress applied to the first area is greater than a bending stress applied to the second areas;
   a driver circuit layer disposed on the second areas and the non-bent areas;
   an organic planarization portion comprising a first organic planarization layer and a second organic planarization layer, wherein the first organic planarization layer is disposed on the first area, and the second organic planarization layer is disposed on the driver circuit layer and the first organic planarization layer; and
   a light-emitting layer disposed on the second organic planarization layer and located on the bent area and the non-bent areas;
   wherein the first area has a width greater than or equal to that of a pixel of the light-emitting layer.

2. The OLED display panel of claim 1, wherein the driver circuit layer comprises a first portion configured to drive the light-emitting layer on the non-bent areas, and a second portion configured to drive the light-emitting layer on the bent area, wherein the first portion is electrically connected to the second portion.

3. The OLED display panel of claim 2, wherein the driver circuit layer comprises a third metal layer disposed on the flexible substrate layer, and the third metal layer comprises a plurality of source electrodes and drain electrodes.

4. The OLED display panel of claim 3, wherein the driver circuit layer further comprises:
   a first insulating layer disposed on the flexible substrate layer;
   a semiconductor material layer disposed on the first insulating layer;
   a second insulting layer disposed on the first insulating layer and the semiconductor material layer;
   a first gate layer disposed on the second insulating layer and located right above the semiconductor material layer;
   a third insulating layer disposed on the first gate layer and the second insulating layer;
   a second gate layer disposed on the third insulating layer and located right above the first gate layer;
   a first interlayer dielectric layer disposed on the second gate layer and the third insulating layer; and
   a second interlayer dielectric layer disposed on the first interlayer dielectric layer, wherein the third metal layer is disposed on the second interlayer dielectric layer.

5. The OLED display panel of claim 3, wherein the light-emitting layer comprises:
   an anode metal layer disposed on the second organic planarization layer;
   an organic light-emitting layer disposed on the anode metal layer; and
   a cathode layer disposed on the organic light-emitting layer.

6. The OLED display panel of claim 5, wherein a first connecting metal is disposed on the first area and is configured to be connected to the drain electrodes on the first area, and the organic planarization portion covers the third metal layer, the first connecting metal, and the first area;
   wherein the organic planarization layer is configured with a first electrically conductive hole exposed to the organic planarization layer so that the first connecting metal is electrically connected to the light-emitting layer.

7. The OLED display panel of claim 6, wherein the anode metal layer extends to the second organic planarization layer on the second portion from the second organic planarization layer on the first portion, and the second organic planarization layer is configured with a second electrically conductive hole exposed to the second organic planarization layer so that the anode metal layer is electrically connected to the drain electrodes.

8. The OLED display panel of claim 5, wherein each of the first organic planarization layer and the second organic planarization layer is formed by one-time deposition.

9. The OLED display panel of claim 8, wherein a second connecting metal is disposed between the first organic planarization layer and the second organic planarization layer and is configured to be connected to the drain electrodes on the first area, and the second organic planarization layer is configured with a third electrically conductive hole exposed to the second organic planarization layer so that the second connecting metal is electrically connected to the anode metal layer.

10. The OLED display panel of claim 8, wherein the anode metal layer extends to the second organic planarization layer on the second portion from the second organic planarization layer on the first portion, and the second organic planarization layer is configured with a fourth electrically conductive hole exposed to the second organic planarization layer so that the drain electrodes are electrically connected to the anode metal layer.

11. An organic light-emitting diode (OLED) display panel, comprising:
- a flexible substrate layer comprising a bent area and two non-bent areas connected to two sides of the bent area, wherein the bent area comprises a first area and two second areas disposed on two opposite sides of the first area, and a bending stress applied to the first area is greater than a bending stress applied to the second areas;
- a driver circuit layer disposed on the second areas and the non-bent areas;
- an organic planarization portion comprising a first organic planarization layer and a second organic planarization layer, wherein the first organic planarization layer is disposed on the first area, and the second organic planarization layer is disposed on the driver circuit layer and the first organic planarization layer; and
- a light-emitting layer disposed on the second organic planarization layer and located on the bent area and the non-bent areas.

12. The OLED display panel of claim 11, wherein the driver circuit layer comprises a first portion configured to drive the light-emitting layer on the non-bent areas, and a second portion configured to drive the light-emitting layer on the bent area, wherein the first portion is electrically connected to the second portion.

13. The OLED display panel of claim 12, wherein the driver circuit layer comprises a third metal layer disposed on the flexible substrate layer, and the third metal layer comprises a plurality of source electrodes and drain electrodes.

14. The OLED display panel of claim 13, wherein the driver circuit layer further comprises:
- a first insulating layer disposed on the flexible substrate layer;
- a semiconductor material layer disposed on the first insulating layer;
- a second insulting layer disposed on the first insulating layer and the semiconductor material layer;
- a first gate layer disposed on the second insulating layer and located right above the semiconductor material layer;
- a third insulating layer disposed on the first gate layer and the second insulating layer;
- a second gate layer disposed on the third insulating layer and located right above the second gate layer;
- a first interlayer dielectric layer disposed on the second gate layer and the third insulating layer; and
- a second interlayer dielectric layer disposed on the first interlayer dielectric layer, wherein the third metal layer is disposed on the second interlayer dielectric layer.

15. The OLED display panel of claim 13, wherein the light-emitting layer comprises:
- an anode metal layer disposed on the second organic planarization layer;
- an organic light-emitting layer disposed on the anode metal layer; and
- a cathode layer disposed on the organic light-emitting layer.

16. The OLED display panel of claim 15, wherein the first organic planarization layer and the second organic planarization layer both are formed by one-time deposition.

17. The OLED display panel of claim 16, wherein a second connecting metal is disposed between the first organic planarization layer and the second organic planarization layer and is configured to be connected to the drain electrodes on the first area, and the second organic planarization layer is configured with a third electrically conductive hole exposed to the second organic planarization layer so that the second connecting metal is electrically connected to the anode metal layer.

18. The OLED display panel of claim 17, wherein the anode metal layer extends to the second organic planarization layer on the second portion from the second organic planarization layer on the first portion, and the second organic planarization layer is configured with a fourth electrically conductive hole exposed to the second organic planarization layer so that the drain electrodes are electrically connected to the anode metal layer.

19. The OLED display panel of claim 15, wherein a first connecting metal is disposed on the first area and is configured to be connected to the drain electrodes on the first area, and the organic planarization portion covers the third metal layer, the first connecting metal, and the first area;
- wherein the organic planarization layer is configured with a first electrically conductive hole exposed to the organic planarization layer so that the first connecting metal is electrically connected to the light-emitting layer.

20. The OLED display panel of claim 19, wherein the anode metal layer extends to the second organic planarization layer on the second portion from the second organic planarization layer on the first portion, and the second organic planarization layer is configured with a second electrically conductive hole exposed to the second organic planarization layer so that the anode metal layer is electrically connected to the drain electrodes.

* * * * *